(12) United States Patent
Hagiwara

(10) Patent No.: US 6,437,851 B2
(45) Date of Patent: Aug. 20, 2002

(54) EXPOSURE APPARATUS

(75) Inventor: Shigeru Hagiwara, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/781,956

(22) Filed: Feb. 14, 2001

Related U.S. Application Data

(60) Division of application No. 09/365,022, filed on Aug. 2, 1999, which is a continuation of application No. 08/838,650, filed on Apr. 9, 1997, now abandoned, which is a continuation-in-part of application No. 08/712,354, filed on Sep. 11, 1996, now abandoned.

(30) Foreign Application Priority Data

| Sep. 12, 1995 | (JP) | ............................................. 7-259259 |
| Sep. 12, 1995 | (JP) | ............................................. 7-259260 |
| Apr. 11, 1996 | (JP) | ............................................. 8-114218 |

(51) Int. Cl.$^7$ ...................... G03B 27/52; G03B 27/42; G03B 27/32
(52) U.S. Cl. ............................. 355/30; 355/53; 355/77
(58) Field of Search ............................. 355/30, 53, 67, 355/77; 62/272, 55.5, 93–94; 250/492.2, 492.22; 356/399–400

(56) References Cited

U.S. PATENT DOCUMENTS

| 2,686,662 A | | 8/1954 | Smith ........................ 165/48.1 |
| 3,767,300 A | | 10/1973 | Brown et al. ................... 355/3 |
| 4,210,001 A | | 7/1980 | Miller, Sr. .................... 62/468 |
| 4,367,787 A | * | 1/1983 | Bradshaw ..................... 165/35 |
| 4,671,076 A | | 6/1987 | Duren .......................... 62/289 |
| 4,690,528 A | | 9/1987 | Tanimoto et al. ........... 353/101 |
| 4,693,091 A | * | 9/1987 | O'Mara et al. ................ 62/272 |
| 4,704,348 A | | 11/1987 | Koizumi et al. ............. 430/327 |
| 4,786,947 A | | 11/1988 | Kosugi et al. ................. 355/30 |
| 4,918,940 A | * | 4/1990 | Buckley ........................ 62/285 |
| 4,939,903 A | | 7/1990 | Goddard ........................ 62/77 |
| 4,998,821 A | | 3/1991 | Ohta et al. ................... 353/122 |
| 5,093,579 A | | 3/1992 | Amemiya et al. ........ 250/453.1 |
| 5,194,893 A | | 3/1993 | Nishi ........................... 355/53 |
| 5,430,303 A | * | 7/1995 | Matsumoto et al. ..... 250/492.2 |
| 5,550,633 A | | 8/1996 | Kamiya ....................... 356/358 |
| 5,685,895 A | | 11/1997 | Hagiwara ..................... 96/117 |
| 5,722,458 A | | 3/1998 | Potter .................... 137/625.47 |
| 6,002,987 A | | 12/1999 | Kamiya et al. ............... 702/56 |
| 6,297,871 B1 | | 10/2001 | Hagiwara ..................... 355/30 |

FOREIGN PATENT DOCUMENTS

JP 3-164624 * 7/1991

\* cited by examiner

*Primary Examiner*—Russell Adams
*Assistant Examiner*—Hung Henry Nguyen
(74) *Attorney, Agent, or Firm*—Oliff & Berridge PLC

(57) ABSTRACT

An exposure apparatus for illuminating a mask pattern and transferring the image of the pattern onto a photosensitive substrate comprises a chamber which houses an exposure unit, an air-conditioner for adjusting the atmosphere in the chamber to a constant condition, a drain for draining condensate produced in the air-conditioner, trapping system for temporarily trapping the condensate before draining it, and a liquid supply system for supplying clean liquid to the trapping system. A U-tube or a solenoid valve is provided at a midway position of a drain pipe for the trapping system to prevent the entry of impurities from the outside into the apparatus. Otherwise, impurities may be prevented from entering by interposing a waterproof filter between the air-conditioner and drain to remove impurities in the condensate produced in the air-conditioner.

19 Claims, 9 Drawing Sheets

EXPOSURE APPARATUS

This is a Division of application Ser. No. 09/365,022 filed Aug. 2, 1999, which in turn is a Continuation of application Ser. No. 08/838,650 filed Apr. 9, 1997, abandoned which in a Continuation-In-Part of application Ser. No. 08/712,354 filed Sep. 11, 1996 abandoned. The entire disclosure of the prior application(s) is hereby incorporated by reference herein in its entirety.

BACKGROUND OF THE INVENTION

1. Field of the Invention

The present invention relates to an exposure apparatus for making semiconductor circuits or the like by photo-lithography, and in particular to an exposure apparatus suitable for exposure of photosensitive substrates coated with chemically amplified resist.

2. Description of the Related Art

A projection exposure apparatus, which is called a stepper, is used in a photo-lithographic process for making semiconductor circuits, liquid crystal substrates, or the like. Because the apparatus needs to control its temperature with a high precision, it has an air-conditioner for this purpose. Because the air-conditioner needs to control the temperature within a very strict range, which may be ±0.1 centigrade, with respect to a set temperature, the air-conditioning system is constructed as a circulatory system. The air-conditioner needs a fan for air circulation. To avoid vibration and other problems, the air-conditioner including a fan needs to be independent of the main body including a chamber, which houses an exposure unit. FIG. 12 is a schematic top plan of a conventional exposure apparatus with an air-conditioner 1 independent of a main body 2. The air-conditioning system in this type of apparatus is described below with reference to FIG. 12.

The main body 2 has a chamber 3 housing an exposure unit, which includes a reticle R and a projection lens PL. Because an apparatus for making semiconductors needs to keep clean, there is a need for the pressure in the chamber 3 to be always positive relatively to that outside the chamber. The pressure difference between the inside and outside of the chamber 3 makes air in the chamber leak out. The leakage needs compensating by supplying air from the outside. Formed for this purpose is an outside air (OA) inlet 6 for natural intake through it to normally take in outside air.

The air-conditioner 1 includes a cooler 7 having radiation fins (not shown), a heater 8 and a fan 9. The air returning from the chamber 3 enters the air-conditioner 1 together with the air supplied from the outside. The air having entered the air-conditioner 1 is first cooled by the cooler 7. On the radiation fins condenses the superfluous moisture brought from the outside by taking in outside air. The condensate is removed as stated later. The cooled air is heated to a desired temperature by the heater 8. The heated air is sent to the main body 2 by the fan 9. A temperature sensor 11 is fitted downstream from the fan 9. The values detected by the sensor 11 are sent to a controller (not shown). Monitoring the output from the sensor 11, the controller controls the cooler 7 and heater 8 so that the difference between the output value and a target temperature is zero. Thus, the temperature is adjusted by feedback control.

The main-body 2 also includes a HEPA (high efficiency particle air) box 13 having a HEPA filter 10. To maintain the cleanliness of the air in the chamber 3, the air having passed through the air-conditioner 1 is cleaned by the filter 10 before supplied to the chamber 3.

Positioned below the cooler 7 is a drain pan 4, to which a drain pipe 5 is connected. The moisture condensed by the cooler 7 is collected by the pan 4. The collected water is drained through the pipe 5 from the apparatus.

Recently, it has been found that a very small amount of gas in a clean room atmosphere affects the reduction projection exposure apparatus or other apparatus for making semiconductors in the atmosphere. This is explained below more specifically.

Sometimes insufficient is the luminance of the light sources of excimer laser exposure apparatus with an excimer laser used as the light source, X-ray exposure apparatus, electron beam exposure apparatus, etc. To cope with the insufficiency by virtue of the high sensitivity of resist, chemically amplified sensitive resist is used. This resist contains an acid-generating agent as the photosensitive agent in it. The acid generated by exposing the resist induces catalytic reaction in the succeeding heat treatment (PEB). This accelerates the insolubilization (negative type) or the solubilization (positive type) in developer of the resist. For example, if a chemically amplified resist is positive, a very small amount of basic gas of a ppb level in the atmosphere neutralizes the acid catalyst generated on the resist surface, and forms a layer which makes the surface slightly soluble. After development by exposure, the resist cross section, which should otherwise be rectangular, has T-shaped eaves. Because a chemically amplified resist, which is a sensitive resist, cannot be used as it is, it may need overcoating, so that the throughput lowers.

As the wavelength of exposure light has been shorter and the illuminance has been higher, such a problem has been occurring that a very small amount of gas in the atmosphere deposits or precipitates as a clouding substance on the surfaces of illumination system members. This is due to the photochemical interaction between the exposure light and the small amount of gas in the atmosphere. The reactant may be ammonia gas or sulfur oxide in the air, an organosilicic compound, or the like. The clouding of illumination system members results in remarkably low illuminance, so that the throughput is reduced.

U.S. Pat. No. 5,430,303 discloses a chemical filter for removing chemical substances, as means for removing a very small amount of gaseous impurities in a clean room atmosphere.

Because a very small amount of such gas exists originally in a clean room, it is desired to remove the gas by some means before the gas enters an exposure apparatus. The removal is difficult, however, due to the structure of the air-conditioner of the apparatus. Specifically, the air-conditioner is open to the outside through the drain piping, which is essential for temperature control. In addition, the heater and cooler of a typical exposure apparatus are positioned immediately upstream from the fan because of the apparatus structure. Because of the fan characteristics, the pressure in the drain pan of the apparatus is negative (about −30 mmAq.) relatively to the atmospheric pressure. As a result, the following disadvantages arise.

1. The drain piping is connected finally to other devices in the semiconductor manufacturing factory where the apparatus is installed. The pressure in the drain pan is negative relatively to the atmospheric pressure. When no water stays in the pan, gaseous impurities from a manufacturing device in the factory may flow through the piping into the apparatus.

2. Chemical substances are produced in the atmospheres of other manufacturing devices by chemical processes of alkaline, acid or other treatment in the devices. Very small amounts of the substances may dissolve in the air-conditioner drainage of the devices. Such substances of a ppb level may probably flow through the drain piping into the exposure apparatus. As far as piping systems are not drains for drainage containing highly concentrated chemical substances, chemical contamination of apparatus has been given no particular consideration in many of them. The air-conditioner drain piping system of an exposure apparatus may be connected to a clean room atmosphere outside the apparatus.

3. Depending on apparatus installation conditions, condensate from the cooler of an exposure apparatus may always stay in the drain pan. In such a case, although no outside air directly enters the apparatus through factory piping, impurities in the outside air may indirectly enter through the staying condensate. A problem arises any way.

4. The condensate staying in the drain pan does not flow out for a long time due to the negative pressure. Therefore, a very small amount of gas in the circulating air dissolves in the staying condensate. After the solution is concentrated, microorganisms etc. may propagate in it. Thus, the condensate may be a secondary source of gas affecting the exposure apparatus, even if the influence of factory piping is small.

SUMMARY OF THE INVENTION

It is the object of the present invention to provide an exposure apparatus which can solve the problems in the conventional art, prevent outside impurities from flowing reversely through the drain and air-conditioner of the apparatus into the apparatus and therefore effectively restrain the production of a layer making the surface of a chemically amplified resist slightly soluble, the decrease in illuminance due to a clouded optical material, and so on.

According to the first aspect of the invention, there is provided an exposure apparatus comprising:

an exposure unit for illuminating a mask pattern to transfer an image of the mask pattern onto a photosensitive substrate;

a chamber which houses the exposure unit, and in which an atmosphere is kept in a constant condition;

an air-conditioner for adjusting the atmosphere in the chamber to the constant condition;

a drain for draining condensate produced in the air-conditioner;

trapping system for temporarily trapping the condensate before draining it; and a liquid supply system for supplying clean liquid continuously or intermittently to the trapping system.

In the exposure apparatus of the invention, during air-conditioning in the air-conditioner, the condensate from a cooler of the air-conditioner is collected temporarily in the trapping system. At the same time, the trapping system is supplied with clean liquid such as clean water continuously or intermittently by the supply system. Therefore, a sufficient amount of water stays always in the trap, and the water in the trap keeps flowing out. consequently, the impurities dissolved in the drainage including the condensate will be diluted, so that it is possible to prevent them from being concentrated. It is also possible to prevent the impurities from being concentrated in the trap. In addition, because clean water flows always into the trap from upstream, substances contained in the water in the trap keep discharged. Therefore, it is possible to prevent impurities from entering indirectly through the piping system downstream from the trap. In other words, it is possible to prevent these impurities from being released again. In this specification, the terms "clean liquid" and "clean water" respectively mean the liquid and water in which the impurities such as ammonia and/or microorganisms have been removed to at least a ppb level.

In the exposure apparatus of the invention, it is preferable that the drain include a drain pipe, and that the trapping system be a U-tube which is a midway portion of the pipe. The U-tube always holds the amount of liquid which is based on the pressure difference between the inside of the air-conditioner and the outside of the apparatus. The trapping system being the U-tube, it is possible to securely collect in the trapping system a constant amount of water, which is based on the difference between the inside and outside pressures, without using a special controller or the like, if clean water flows together with the condensate into the trapping system from upstream. The portion of the water in excess of the constant amount keeps flowing out.

The trapping system may be a drain pan interposed between the air-conditioner and drain. The drain pan may be structured to receive the condensate from the air-conditioner. The drain pan may be connected to the inlet end of the drain pipe. The drain pan is advantageous if the exposure apparatus is installed on a solid floor, where there is no sufficient difference of elevation for forming a U-shaped piping portion as stated above. In such a case, it is preferable that there be such an amount of water in the pan that the water surface in the drain pan is always higher than the top of the inlet end of the drain piping. This can prevent air which contains impurities from reversely flowing directly into the apparatus from the piping downstream from the drain pan. In such a case, by supplying the drain pan with clean water continuously or intermittently, polar molecules such as ammonia which are highly soluble in water dissolve in the water in the drainpan, and are discharged from the exposure apparatus. Therefore, the drain pan functions as a quasi-chemical filter.

It is preferable that the exposure apparatus comprise a detector for directly or indirectly detecting the amount of the liquid in the trapping system, and a flow controller for controlling on the basis of the results of the detection by the detector the quantity of the liquid supplied by the liquid supply system so that a substantially constant amount of liquid always stays in the trapping system. The detector for directly detecting the amount of liquid may be a level sensor for detecting the height of the water surface in the trapping system. The detector for indirect detection may be a flow sensor for detecting the flow rate of the water flowing out of the trapping system, or a flow sensor for detecting the total flow of the water, which includes the condensate, flowing into the trapping system. By thus providing the detector and the flow controller, the quantity of water supplied from the supply system is controlled so that there is a nearly constant amount of water always in the trapping system. Therefore, if the trapping system is a drain pan, it is possible to set the amount of water so that the water surface in the pan is always higher than the top of the inlet end of the drain piping. It is also possible to keep the flow rate at a certain value or higher so that no water in the drain pan stagnates.

According to the second aspect of the invention, an exposure apparatus comprising:

an exposure unit in which a mask pattern is illuminated and its image is transferred onto a photosensitive substrate;

a chamber which houses the exposure unit, and in which an atmosphere is kept in a constant condition;

an air-conditioner for adjusting the atmosphere in the chamber unit to the constant condition;

a drain for draining condensate produced in the air-conditioner; and a filter interposed between the air-conditioner and the drain for removing impurities in the condensate produced in the air-conditioner.

In the exposure apparatus of the invention, the filter can remove impurities in the condensate, and adsorb gaseous impurities which have entered from outside through the drain channel of the drain, and therefore prevents them from entering the exposure unit. Consequently, it is possible to effectively prevent impurities from being accumulated at the drain channel inlet, where a drain pan; is fitted in general.

The filter may be a waterproof chemical filter, which may be fitted at the end of the drain channel, which is adjacent to the air-conditioner, in such a manner that the filter constitutes a partition between the inside of the air-conditioner and the inside of the drain channel. The drain channel interconnects the air-conditioner and the outside of the apparatus. It is preferable that the structure of the chemical filter be so devised or adapted that the pressure loss of the filter is set at a large value to some extent. In such a case, the filter itself is a trap, which prevents polluted air from flowing reversely from the drain pipe.

An ion sensor may be fitted to the filter. The sensor can detect the concentration of the impurities adsorbed by the filter. Consequently, it is possible to judge the filter life, and therefore judge exactly when to replace the filter.

According to the third aspect of the invention, there is provided an exposure apparatus comprising;

an exposure unit for illuminating a mask pattern to transfer an image of the mask pattern onto a photosensitive substrate;

a chamber which houses the exposure unit, and in which an atmosphere is kept in a constant condition;

an air-conditioner for adjusting the atmosphere in the chamber to the constant condition;

a trapping system for temporarily trapping condensate produced in the air-conditioner;

a detector for detecting the amount of the liquid in the trapping system;

a drain path for draining the condensate in the trapping system to the outside of the exposure apparatus;

an opening/closing mechanism provided in the drain path for opening and closing the drain path; and a controller for controlling the opening/closing mechanism according to the amount of the liquid in the trapping system detected by the detector.

When the air-conditioner performs an air-conditioning operation while the opening/closing mechanism is closed, the condensate from the air-conditioner, especially, a cooler of the air-conditioner, is collected temporarily in the trapping system. The amount of the liquid collected in the trapping system is monitored by the detector. The controller controls the opening/closing mechanism according to the amount of the liquid in the trapping system that was detected by the detector. Normally, therefore, a reverse flow of dirty air containing pollutants from the downstream side of the drain path can be blocked by closing the opening/closing mechanism. When a certain amount of the liquid (condensate) accumulates in the trapping system, on the other hand, the opening/closing mechanism is opened to drain the liquid collected in the trapping system to the outside through the drain path. By so doing, it becomes possible to prevent an undesired degree of buildup of the pollutants in the liquid collected in the trapping system.

Depending on the environment where the exposure apparatus is installed, the humidity of the atmosphere makes a difference. This produces a difference in the amount of the liquid collected in the trapping system. According to the present invention, by contrast, the amount of the liquid in the trapping system is monitored by the detector. The controller can control the opening/closing mechanism according to this amount. Therefore, the amount of the liquid in the trapping system is not affected by the environment of installation.

The exposure apparatus,.the third aspect of the invention, further includes a cleaning device having a liquid supply system for supplying a clean liquid continuously or intermittently to the trapping system. The controller can control the opening/closing mechanism and the cleaning device, for example, in the following manner: As mentioned above, the opening/closing mechanism is opened to drain the liquid in the trapping system through the drain path. When this liquid has been drained off (or the liquid remaining in the trapping system reaches a certain amount), the controller controls the cleaning device so that a clean liquid is supplied by the liquid supply system continuously (or intermittently) to the trapping system for cleaning purposes. The cleaning liquid washes the trapping system. Even if the concentration of the impurities in the trapping system occurs somewhat, the concentrated impurities will be washed away, and can thus be prevented from being released again from there.

In the exposure apparatus as the third aspect, when a predetermined upper-limit amount of the liquid is trapped in the trapping system, the controller opens the opening/closing mechanism. When the liquid in the trapping system has been drained to reach less than a predetermined amount, the controller starts liquid supply from the liquid supply system to the trapping system. After cleaning by the cleaning device is completed, the liquid used to clean the trapping system is drained. When this liquid has been drained to reach below a predetermined lower-limit amount, the controller can close the opening/closing mechanism.

In other words, the controller opens the opening/closing mechanism when the predetermined upper-level amount of the liquid has been accumulated in the trapping system. As a result, the liquid accumulated in the trapping system is drained to the outside through the drain path. When the liquid in the trapping system has been drained to less than a predetermined amount, liquid supply by the liquid supply system to the trapping system started by the controller. As a result, the trapping system is washed with a cleaning liquid. This washing is carried out using, say, a certain amount of clean water. During this procedure, the opening/closing mechanism remains open. After cleaning (washing) by the cleaning device is completed, the liquid used for the cleaning of the trapping system is drained. At a time when this liquid has been drained to less than the predetermined lower-level amount, the controller closes the opening/closing mechanism. After that, the opening/closing mechanism is never opened until a certain amount of the liquid is accumulated in the trapping system.

According to the above-described constitution, the cleaning liquid flows through the drain path during cleaning (washing). A certain time after completion of cleaning, a flow of this cleaning liquid nearly vanishes. At a time when this has occurred, and after then, the opening/closing mechanism keeps closed. Thus, reverse flow of the impurities from the piping system downstream from the trapping system can be prevented nearly without fail.

The exposure apparatus as the third aspect may further include a pump for forcing the liquid in the trapping system into the drain path. The air-conditioner is in a vacuum in order to circulate clean air into the exposure apparatus. Thus, simply by opening the opening/closing mechanism to leave the drain path open, not all of the liquid accumulated in the trapping system may be drained promptly. Even under these circumstances, the liquid in the trapping system can be forced by the drain pump into the drain path. Because of this constitution, the dwell time of the liquid in the trapping system can be shortened, even when the vacuum of the air-conditioner is high. Consequently, the dissolution and concentration of the impurities can be minimized.

In the exposure apparatus as the third aspect, the clean liquid may be water containing a trace amount of a germicidal ingredient and substantially free from chemical impurities or microorganisms. The chemical impurities refer, for example, to nitrogen compounds which chemically change into substances, such as ammonia gas, that will cause T-shaped deformation of a chemically amplified resist upon photochemical interaction. The microorganisms include, for example, bacteria. The freedom from the chemical impurities or microorganisms refers, for instance, to the removal of them to a ppb level or less. A typical example of the germicidal ingredient is hydrogen peroxide. The use of such water can restrain the multiplication of microorganisms in the trapping system, and also prevent the chemical change of chemical impurities, such as the conversion of nitrogen compounds into ammonia, etc.

According to the fourth aspect of the invention, there is provided an exposure apparatus comprising:

- an exposure unit for illuminating a mask pattern to transfer an image of the mask pattern onto a photosensitive substrate;
- a chamber which houses the exposure unit, and in which an atmosphere is kept in a constant condition;
- an air-conditioner for adjusting the atmosphere in the chamber to the constant condition;
- a trapping system for temporarily trapping condensate produced in the air-conditioner;
- a drain path for draining the condensate in the trapping system to the outside of the exposure apparatus; and
- a mechanism provided in the drain path for preventing a pollutant from entering the air-conditioner from the outside of the exposure apparatus through the drain path.

In the exposure apparatus as the fourth aspect, the mechanism for preventing a pollutant from entering the air-conditioner from the outside of the exposure apparatus through the drain path may be a U-tube, and a liquid supply system for supplying a clean liquid to the trapping system; or may be a solenoid valve for opening and closing the drain path.

BRIEF DESCRIPTION OF THE DRAWINGS

Preferred embodiments of the present invention are shown in the accompanying drawings, in which.

DETAILED DESCRIPTION OF PREFERRED EMBODIMENTS

First Embodiment

The first embodiment of the present invention is described below with reference to FIGS. 1–4. In FIGS. 1–4 and FIG. 12, which shows the conventional art, the same numerals and symbols represent identical or equivalent components or parts.

Figure 1:
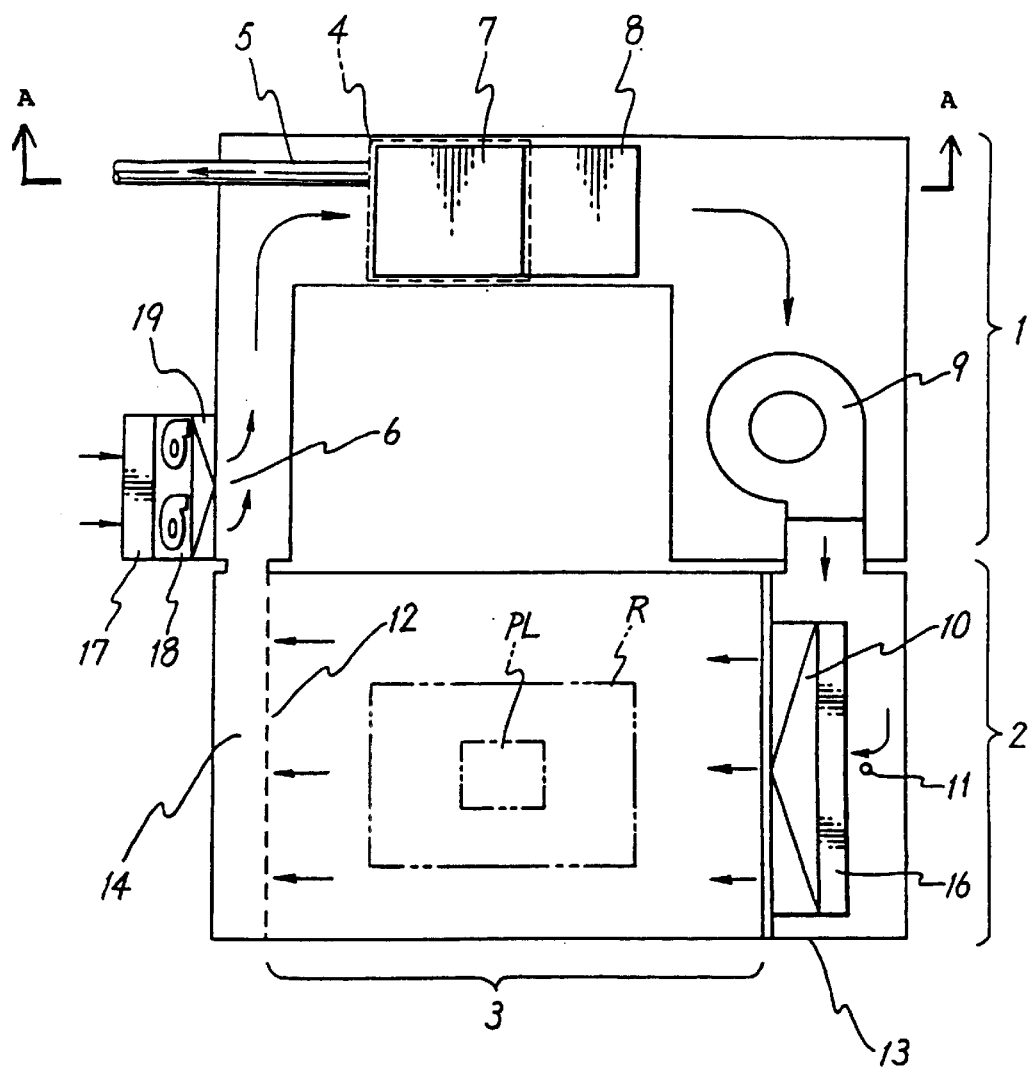
FIG. 1 is a schematic top plan view of an exposure apparatus according to the first embodiment.

The exposure apparatus shown in FIG. 1 is a projection exposure apparatus, which is generally called a stepper and used to make semiconductor circuits by photo-lithography. In general, this type of apparatus is installed in a factory for making semiconductor devices or elements. The apparatus consists of an air-conditioner 1 and a main body 2. The body 2 has a chamber 3 housing an exposure unit, which includes a reticle R and a projecting optical system PL. The exposing unit also includes a light source, a lighting system, a stage and a wafer, which are not shown. The light source, which may be an excimer laser or a mercury (vapor) lamp, can radiate exposure light. The light is arranged by the lighting system, which includes lenses and a mirror, so as to have required wavelength, magnitude and illuminance uniformity. The arranged light illuminates the reticle R having a specified pattern formed in it. The pattern is then transferred through the optical system PL to the wafer as an exposed substrate laid on the stage. The wafer is coated with chemically amplified resist. The environmental conditions (cleanliness, temperature, pressure, humidity, etc.) in the chamber 3 are kept nearly constant. The details of the body 2 may be the same as described in U.S. Pat. No. 5,430,303 or U.S. Pat. No. 5,194,893, which discloses a scanning exposure apparatus. The disclosures of these patents are incorporated as part of the description herein by reference.

An HEPA (high efficiency particle air) box 13 is fitted to the inlet of the body 2, that is, upstream (right side in FIG. 1) of the chamber 3. Fitted in the box 13 is an HEPA filter 10 for cleaning the air flowing into the chamber 3. Fitted upstream of the filter 10 is a chemical filter 16 for preventing the chemically amplified resist from being "T-shaped", as disclosed in U.S. Pat. No. 5,430,303. The chemical filter 16 is an air filter for removing chemical substances, and may have any mechanism and material for removing impurities.

Fitted near the chemical filter 16 in the HEPA box 13 is a temperature sensor 11 for temperature control as stated later. Formed on the downstream side (left side in FIG. 1) of the chamber 13 is a return passage 12 for returning the air in the chamber 13 into a return duct 14.

Figure 2:
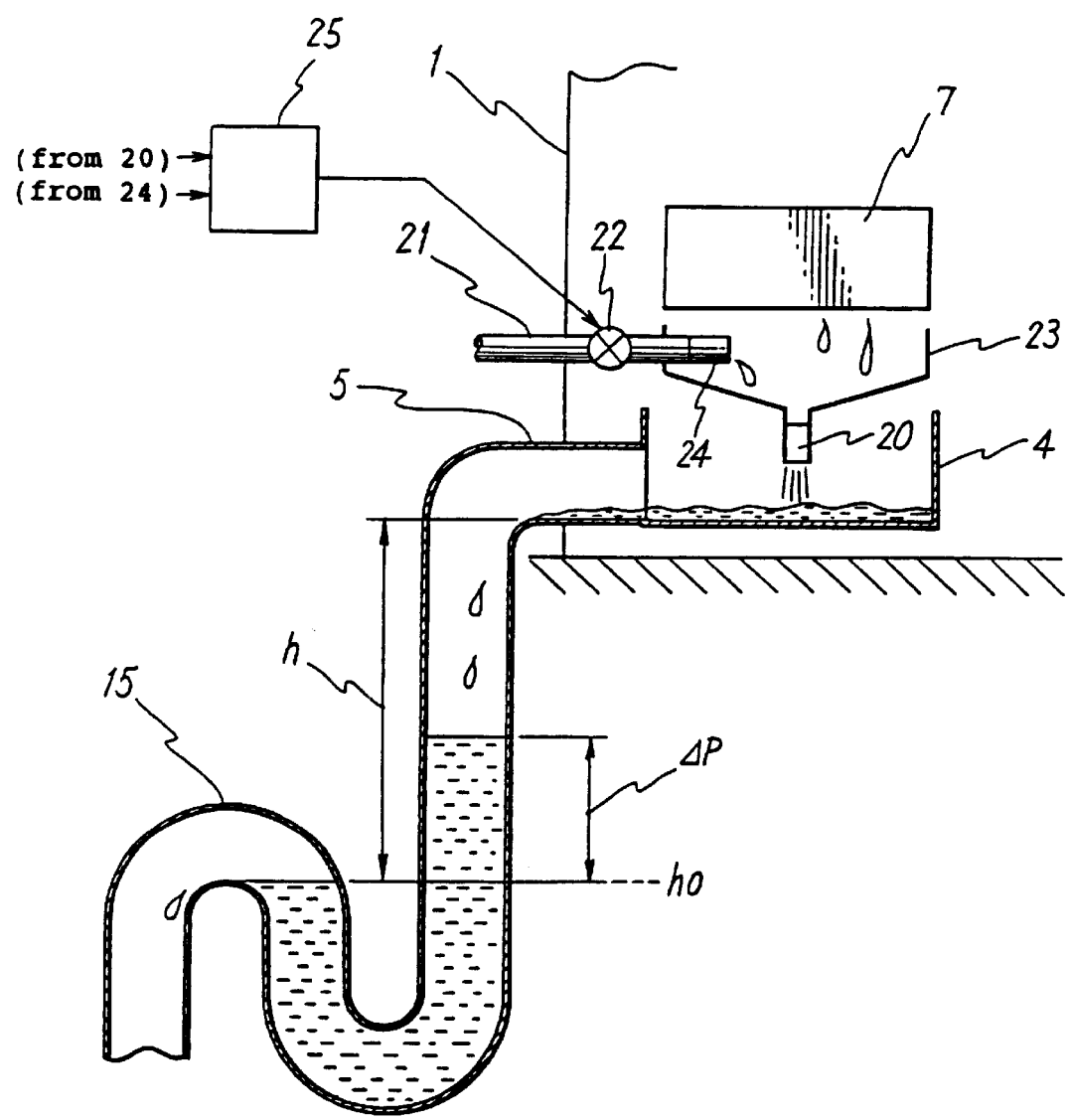
FIG. 2 is a fragmentary view in vertical cross section of the apparatus of FIG. 1, showing the structure near the drain pan.

The air-conditioner 1 for air-conditioning in the chamber 3 includes a cooler 7, a heater 8 and a fan 9. As best shown in FIG. 2, a drain pan 4 is positioned below the cooler 7 to drain the moisture condensed on radiation fins (not shown). The pan 4 is connected to one end of a drain pipe 5.

The interior of the chamber 3 is kept under positive pressure to maintain its cleanliness. Consequently, air leaks out of the chamber 3 through the clearances at the front side of the chamber, an in-line interface (not shown), etc. To compensate the leakage, outside air is taken in through an outside air inlet port 6, which is formed in a side wall of the apparatus and communicates with the return duct 14. In order to prevent the chemically amplified resist from being "T-shaped" and for other purposes, a chemical filter 17 is fitted in the port 6. The filter 17 is similar to the chemical filter 16, and can take in only clean air into the apparatus by removing chemical substances (impurities) in the air taken in through the port 6. Because dust from the filter 17 may enter the apparatus, an HEPA filter 19 is fitted inward or downstream from the filter 17 in the port 6. If the pressure loss of the HEPA filter 19 itself is large, it is preferable to interpose fans 18 between the filters 17 and 19 in order to secure a required supply of air.

The air-conditioning of the apparatus is explained below. The air which has flowed through the chamber 13 is returned through the return passage 12 into the return duct 14. The returned air enters the air-conditioner 1 together with the outside air taken in through the OA port 6. The mixed air which has entered the air-conditioner 1 is first cooled by the cooler 7. The radiation fins condense the superfluous moisture brought from the outside with the air taken in. The condensed moisture is removed. The cooled air is heated to a desired temperature by the heater 8. The heated air is supplied by the fan 9 to the main body 2.

The chemical filter 16 and HEPA filter 10 clean the air which has entered the main body 2. As a result, the chamber 3 is supplied with only the air of high cleanliness, which contains no fine particles. Similarly to the conventional art, the temperature of the air supplied from the air-conditioner 1 to the body 2 is adjusted by the feedback control with a controller (not shown), which controls the cooler 7 and heater 8 on the basis of the output from the temperature sensor 11.

Figure 3:
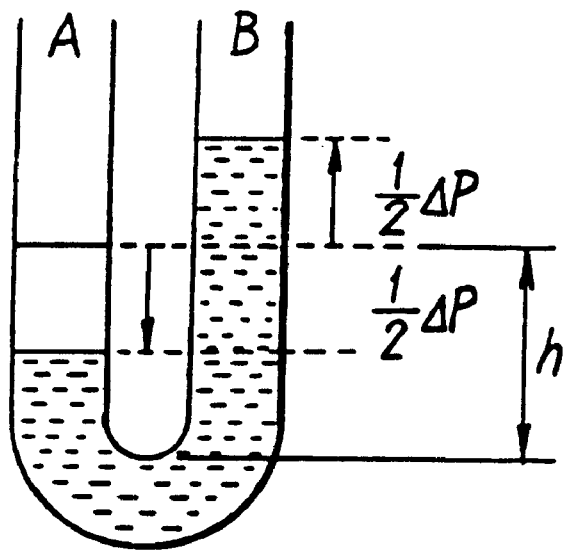
FIG. 3 is a vertical cross section showing the principle of the trap of FIG. 2.

As shown in FIG. 2, the drain pipe 5 has a trap 15 in the form of a U-shaped portion of the pipe, which constitutes a water collector. The trap 15 prevents outside air from entering from the piping downstream or outward of the drain against the temperature control drainage discharged from the apparatus through the pipe 5. The principle of the trap 15 is explained below with reference to FIG. 3. As shown in FIG. 3, there is a pressure difference between the end points A and B of a U-tube. It is assumed that the pressure at the point A is higher by $\Delta P$ [mmAq.] than that at the point B. If there is no water in the tube, the air flows in accordance with the pressure gradient. If there were no pressure difference with water in the tube, the water surfaces would balance with each other at a height h of the water columns. The pressure difference $\Delta P$ [mmAq.] between the points A and B moves the surfaces by $\frac{1}{2}\Delta P$ from the height h, resulting in a difference of elevation $\Delta P$ [mm] between the surfaces. Therefore, a trap of the tube which can resist the pressure difference $\Delta P$ [mmAq.] needs to contain such an amount of water that the height h of the balanced water surfaces is greater than $\Delta P/2$, as shown in FIG. 3. In fact, because the drainage through the trap 15 needs to flow into piping of a factory, the shape of the trap 15 is like an inverted S, as shown in FIG. 2.

Figure 4:
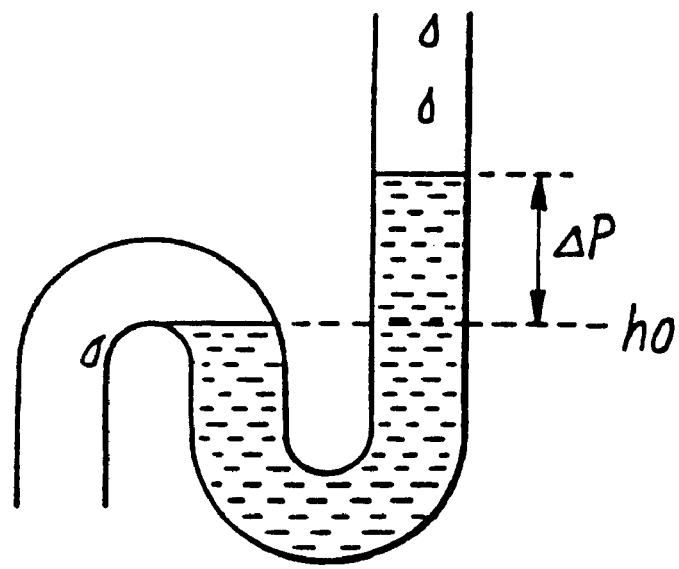
FIG. 4 is a vertical cross section of the trap of FIG. 2.

The fan 9 keeps the pressure in the air-conditioner 1 negative in comparison with the pressure outside the air-conditioner. If the pressure difference between the inside and outside of the air-conditioner 1 is $\Delta P$ [mmAq.], the water surface on the inner side of the trap 15, which is provided outside, is higher by $\Delta P$ [mm] than the height ho of the water surface on the outer side, as shown in FIGS. 2 and 4. For this reason, the height h (FIG. 2) between the height ho and the bottom of the inner end of the drain pipe 5 is sufficiently greater than $\Delta P$ [mm].

As shown in FIG. 2, a collecting funnel 23 is positioned over the drain pan 4. The bottom of the funnel 23 is fitted with a flow sensor 20. One end of pure water supply piping 21 extends through a side wall of the funnel 23. The piping 21 is made of chemically stable clean material. The funnel 23 is always supplied with a small quantity of pure (clean) water cleaned chemically through a filter (not shown) in the piping 21. The drain pan 4 is supplied with the pure water mixed in the funnel 23 with the drops of dew from the cooler 7.

Normally, the superfluous moisture in the atmosphere is condensed into drops of water by the cooler 7 in the air-conditioner 1. The drops are collected in the drain pan 4. The water in the pan 4 flows through the drain pipe 5 to the trap 15. In some environments where pieces of exposure apparatus are installed, little moisture condenses. In such a case,-air polluted with impurities such as a very small amount of other gas may flow reversely through the drain pipe. According to this embodiment, however, the pan 4 is always supplied with pure water cleaned chemically through a filter (not shown). Consequently, it is possible to supply the trap 15 with a sufficient quantity of water through the pipe 5. As a result, polluted air can be prevented from flowing into the apparatus.

Contrariwise, if an exposure apparatus is installed in an environment where a large quantity of moisture condenses, deposit or sludge from the cooling fins of the cooler or a very small quantity of gas in the atmosphere may dissolve in the water in the drain pan, so that the impurities in the water may be more concentrated. According to this embodiment, however, the drain pan 4 is always supplied with pure water, with which to dilute the impurities dissolved in the drainage. It is therefore possible to prevent the impurities from being concentrated in the pan 4.

The outlet of the pure water supply piping 21 has a flow sensor 24 for detecting the flow rate of the pure water supplied through the piping 21 to the collecting funnel 23. The piping 21 has a solenoid valve 22 for adjusting the supply flow rate of the pure water through the piping 21.

The trap 15 cannot function if at least a certain amount of water is not kept in it. In addition, if only a small quantity of water flows into the trap 15, the water stagnates in it for a long time. Such disadvantages can be avoided or overcome by a controller 25 monitoring the outputs from the flow sensors 24 and 20, and controlling the solenoid valve 22 so that at least a certain quantity of water flows into the drain pan 4, and eventually into the trap 15. The controller 25 and valve 22 constitute a flow control system.

As described above, clean water is made to flow always to the trap 15 from the drain pan 4 etc. upstream of the trap 15 so as to keep a certain amount of water in the trap 15. In addition, the substances contained in the water in the trap 15 keep discharged, so that the impurities brought from the piping system downstream of the trap 15 can be prevented from entering indirectly, that is, being released again.

By fitting the chemical substance removal filter in the internal circulatory system of the apparatus, the life of the system can be fairly long. If there were no space for the collecting funnel 23, the funnel 23 might be omitted with the flow sensor 20 fitted in the inlet of the drain pipe 5.

In this embodiment, while the flow sensors 20 and 24 are detecting the supply flow rate of pure water and the flow rate of the water supplied to the drain pan 4, pure water keeps supplied. The invention, however, is not limited to the embodiment. The control system could be simplified by omitting the collecting funnel 23 and the sensors 20 and 24, and instead using a timer etc. to intermittently supply pure water from the supply piping 21. For example, pure water may be supplied in the order of one liter at a time per hour. Otherwise, the apparatus might be so adapted that the operator can arbitrarily supply water.

Instead of supplying pure water inside the apparatus, pure water might be supplied outside it, for example, at the piping 5. It is important to form a trap downstream from the drain piping in order to prevent outside air from entering from the piping downstream of the drain. Therefore, if there were a plurality of air-conditioning systems and drain pipes, the pipes would need to each have a trap, and to meet together downstream from the traps.

Second Embodiment

Figure 5:
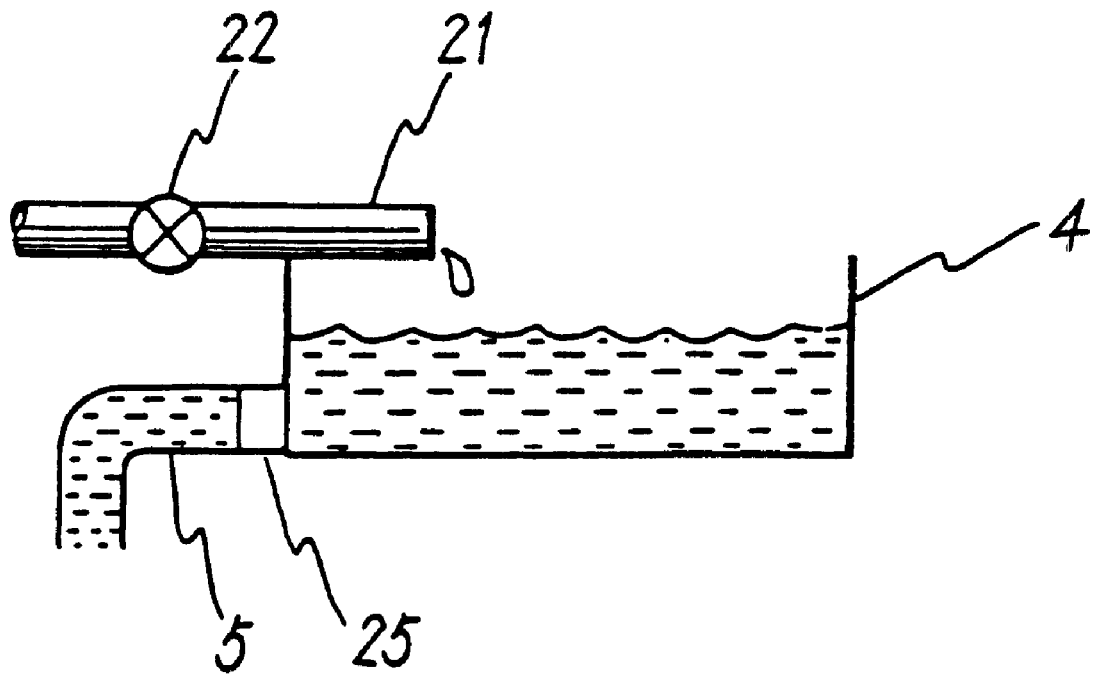
FIG. 5 is a fragmentary view in vertical cross section of an exposure apparatus according to the second embodiment.

The second embodiment of the invention is described below with reference to FIG. 5. In FIG. 5, the components identical or equivalent to those of the conventional art and first embodiment are assigned the same numerals as used in FIG. 1, and are briefly explained or not explained. FIG. 5 shows main part of this embodiment. With reference to FIG. 5, the collecting funnel 23 and flow sensors 20 and 24 of the first embodiment are omitted. Pure water is supplied from the pure water supply piping 21 directly to the drain pan 4. The flow rate of the water flowing from the pan 4 to the drain pipe 5 is detected by a flow sensor 25, which is fitted in the inlet of the pipe 5. The structure of the other parts is identical with that of the first embodiment.

As shown in FIG. 5, clean water is supplied so that water always stays in the drain pan 4 to such a degree that the water surface in the pan 4 is higher than the top of the inlet of the drain pipe 5. In order for the water in the pan 4 not to stagnate, the flow sensor 25 detects the drainage flow rate so that at least a certain amount of water always exists in the pan 4. Thus, the pan 4 itself functions as a water collector equivalent to the trap 15 of the first embodiment.

By supplying water to the drain pan 4 of this embodiment continuously or intermittently, polar molecules such as ammonia, which has high solubility, dissolve in the water at any time and are discharged with it from the apparatus. Therefore, the pan 4 functions as a quasi-chemical filter.

As stated above, the drain pan 4 itself of this embodiment functions equivalently to the trap 15 of the first embodiment. Therefore, similarly to the first embodiment, it is possible to prevent impurities from factory piping from entering the exposure apparatus, and the impurities in the pan 4 from being concentrated. As a result, the chemical atmosphere in the apparatus can always be kept clean. The apparatus of this embodiment is effective particularly if it is installed on a solid floor where the difference of elevation required for forming a trap cannot be secured.

The flow sensor 25 for detecting the drainage flow rate constitutes a detector. Instead, a detector might be constituted by a level sensor for detecting the water surface in the drain pan 4. In short, it is sufficient to be able to check that a certain amount of water exists in the pan 4 as a water collector, and that the pan 4 functions equivalently to the trap 15 of the first embodiment.

Third Embodiment

In the conventional exposure apparatus, the superfluous moisture in the atmosphere is normally condensed by the cooler 7 in the air-conditioner 1, and collected into the drain pan 4. If the apparatus is installed in an environment where little moisture condenses, air polluted with impurities such as a very small amount of other gas may flow reversely through the drain pipe 5. In an environment where a large quantity of moisture condenses, deposit or sludge from the cooling fins of the cooler 7 or a very small quantity of gas in the atmosphere may dissolve in the water in the pan 4, so that the impurities in the water may be more concentrated. These disadvantages can be avoided or overcome by this embodiment adopting different structure for the air-conditioner from those of the first and second embodiments.

Figure 6:
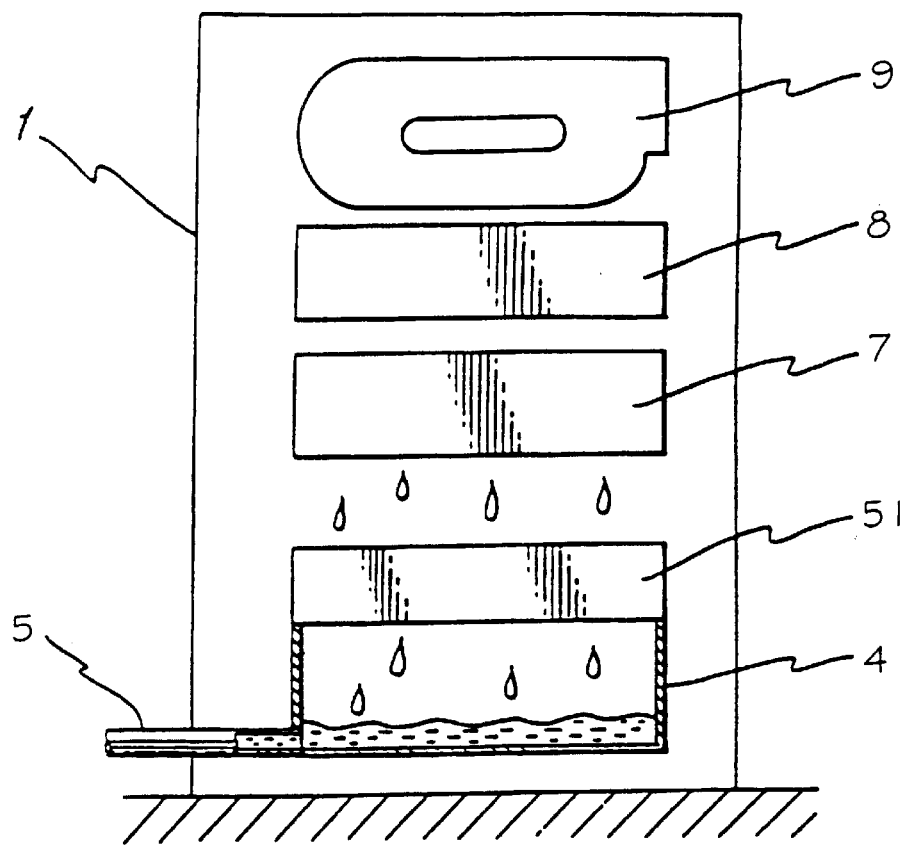
FIG. 6 is a conceptual view in vertical cross section of the air-conditioner of an exposure apparatus according to the third embodiment.

FIG. 6 conceptually shows the structure of the air-conditioner 1 in vertical cross section along the line A–A of FIG. 1. The basic structure of the main body and air-conditioner of the exposure apparatus according to this embodiment is as shown in FIG. 1. Explained below are the points of the air-conditioner which differ from those in the first and second embodiments. As shown in FIG. 6, the air-conditioner 1 of this embodiment includes a drain pan 4 for receiving the drops of dew produced on the radiation fins (not shown) of a cooler 7. A waterproof chemical filter 51 is placed on top of the pan 4. The filter 51 divides the interior of the air-conditioner 1 from the drainage channel consisting of the pan 4 and a drain pipe 5, which is connected to the pan 4. The junction between the filter 51 and pan 4 is sealed so sufficiently that outside air, even if it flows reversely from the pipe 5 toward the apparatus, passes all through the filter 51 before it enters the apparatus.

The chemical filter 51 adsorbs gaseous impurities flowing reversely from downstream of the drain pan 4, in order to prevent them from entering the main body. The filter 51 also removes impurities contained in the drops of dew falling from the radiation fins of the cooler 7, in order to prevent impurities from being accumulated and concentrated in the pan 4. For these purposes, the filter 51 is a chemical substance adsorption filter, which is a filter for both gas and liquid, and which does not lose its function when wet with water. For example, the filter 51 may be a waterproof chemical filter made of ion exchange resin or the like, which adsorbs and removes ammonia and other polar substances (a type of impurity). The waterproof chemical filter might be made of activated carbon or other adsorbent.

The fan 9 keeps the pressure in the air-conditioner 1 negative. In order to prevent air downstream of the drain pipe 5 from flowing reversely due to the pressure difference between inside and outside, the pressure loss $\Delta PF$ of the chemical filter 51 itself is set to be large to some extent so that the filter 51 serves the same as a piping trap. If the filter 51 is made of fiber of ion exchange resin in the form of layers of pleated cloth, the adsorption capacity, pressure loss $\Delta PF$ and trap(ping) effect of the filter 51 increase with the number of layers and the number of pleats. If the pressure loss is large, it is difficult for vapor phase substances to move. There is no problem, however, because the condensate from the cooler 7 is moved toward the drain pan 4 by penetration or elan permeation. As the moisture which a chemical filter of ion exchange resin holds becomes large, the reactivity of polar substances such as ammonia and amines are accelerated. Therefore, this embodiment is advantageous also in terms of removal of polar substances and other impurities.

As stated above, the waterproof chemical filter 51 placed over the drain pan 4 can prevent impurities from factory piping from entering the apparatus, and the impurities in the pan 4 from being concentrated. As a result, the chemical atmosphere in the apparatus can keep clean. Therefore, the life of the internal circulatory system of the apparatus can be fairly long by fitting the system with the chemical substance removal filter.

Fourth Embodiment

Figure 7:
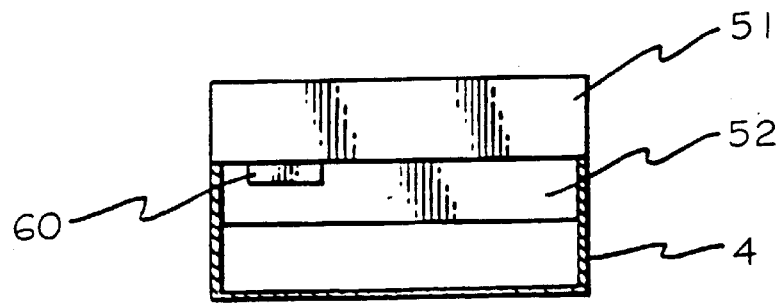
FIG. 7 is a vertical cross section of the chemical filters and other parts in the air-conditioner of an exposure apparatus according to the fourth embodiment.

FIG. 7 shows modifications in structure of the chemical filter 51 and drain pan 4 of the third embodiment. As shown in FIG. 7, a semiconductor ion sensor 60 is fitted between two chemical filter 51 and 52 in order for the operator to know when the filters should be replaced.

The semiconductor ion sensor 60 may have an ion selective electrode (film) for detecting the concentration of $NH_4^+$ instead of a metal electrode for the gate of a MOSFET. Impurities penetrate through the upper chemical filter 51 from the top and through the lower filter 52 from the bottom. The sensor 60 between the filter 51 and 52 detects the ion concentration of the ppm order at it, so that a warning device (not shown) such as a lamp and a buzzer makes the operator know when to replace the filters. The order of the concentration at which the filters should be replaced is high in consideration of actual circumstances etc. One of the circumstances is that, as a chemical filter is more contaminated and adsorbs more impurities, the concentration of the impurities in it becomes higher. The other circumstance is that it is not possible for a semiconductor ion sensor, because of its performance or sensitivity, to accurately detect ion concentration lower than the ppm order. According to this embodiment, it is possible to judge accurately when to replace the waterproof chemical filters 15.

Fifth Embodiment

The exposure apparatus of this embodiment has constituent elements in common with the exposure apparatus of the first embodiment, and thus its description uses FIG. 1. The same constituent elements as in the first embodiment are assigned the same numerals and symbols as used therein. As shown in FIG. 1, the exposure apparatus consists of two parts, an air-conditioner 1 and a main body 2.

The main body 2 has a chamber 3, which houses an exposure unit (to be described later on) for transferring a pattern of a reticle R as a mask via a projecting optical system PL onto a substrate to be exposed. The environmental conditions (cleanliness, temperature, pressure, humidity, etc.) in the chamber 3 are kept nearly constant.

Figure 8:
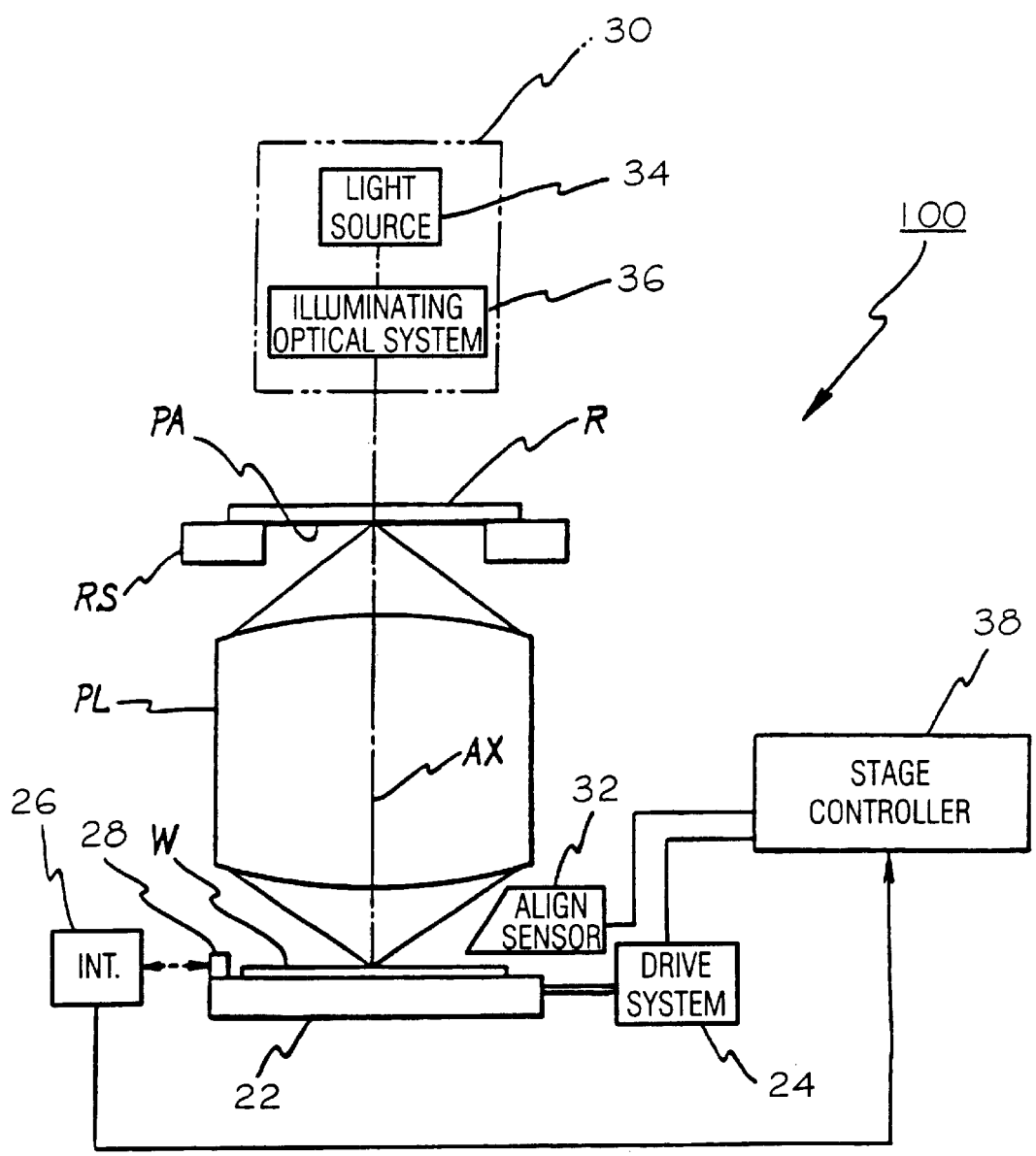
FIG. 8 is a schematic view of the structure of the exposure unit of an exposure apparatus according to the fifth embodiment.

FIG. 8 schematically shows the structure of an exposure unit 100. The exposure unit 100 comprises a substrate stage 22 bearing a substrate to be exposed, W, such as a wafer, and moving in a horizontal plane two-dimensionally; a drive system 24 for driving the substrate stage 22; a projecting optical system PL disposed above the substrate W with its optical axis AX being normal to the moving plane of the stage 22; a reticle stage RS disposed above the projecting optical system PL for holding a reticle R parallel to the moving plane of the stage 22; and an illumination system 30 disposed above the reticle R.

A moving mirror 28 is fixed onto the substrate stage 22. The two-dimensional coordinate position of the substrate stage 22, i.e., the position of the substrate W, is measured by a laser interferometer 26 which casts a laser beam on the moving mirror 28. The positional information obtained by means of the laser interferometer 26 is fed to a stage controller 38 which controls the position of the substrate stage 22 via the drive system 24. Above the substrate W, an off-axis alignment sensor 32 is disposed for detecting an alignment mark formed on the substrate W. The output of this alignment sensor 32 is also supplied to the stage controller 38.

The illumination system 30 includes a light source 34, and an illuminating optical system 36 having various lenses, mirrors, blinds, and aperture stops (none shown). The light source 34 is an excimer laser such as a laser from KrF (wavelength 248 nm) or ArF (wavelength 193 nm). In harmony with this, the instant embodiment uses as the substrate W to be exposed a substrate, such as a wafer, coated on its surface with a chemically amplified resist for excimer light. The reason for this use is as follows: When excimer light is projected onto a novolak resin, absorption by the resist rein is so great that adequate energy does not reach the bottom layer of the resist, thereby minimizing resolution. Thus, a highly transparent resin should be used, but such a resin has low sensitivity. A contrivance for increasing the sensitivity is required. A means of imparting increased sensitivity is the use of a chemically amplified resist for excimer light, the resist showing a chemical amplification effect.

According to the exposure unit 100, the stage controller 38 aligns the substrate W with the reticle R by use of the alignment sensor. 32 to perform exposure in the following manner: Exposing light emitted by the light source 34 is configured to the required wavelength, size and illuminance uniformity while passing through the illuminating optical system 36. Then, this light illuminates the reticle R. A circuit pattern formed on a pattern surface PA of this reticle R is transferred through the projecting optical system PL to the substrate W to be exposed that is laid on the substrate stage 22.

Returning to FIG. 1, an HEPA box 13 is fitted to the inlet of the body 2, that is, upstream (right side in FIG. 1) of the chamber 3. Inside the HEPA box 13, an HEPA filter 10 is provided for cleaning air flowing into the chamber 3. In the instant embodiment, moreover, a chemical filter 16 as used in the first embodiment is provided upstream from the HEPA filter 10.

Near the chemical filter 16 in the HEPA box 13, a temperature sensor 11 is disposed for temperature control to be described later on.

On the most downstream side (left side in FIG. 1) of the chamber 13, a return passage 12 is formed for returning the air in the chamber 13 into a return duct 14.

The air-conditioner 1, a constituent part for air-conditioning in the chamber 3, includes a cooler 7, a heater 8 and a fan 9. Below the cooler 7 and deep in the sheet face of FIG. 1, a drain pan 4 is positioned as a water reservoir for receiving and draining the moisture condensed on radiation fins (not shown). The drain pan is connected to one end of a drain pipe 5 constituting a drain path.

Figure 9:
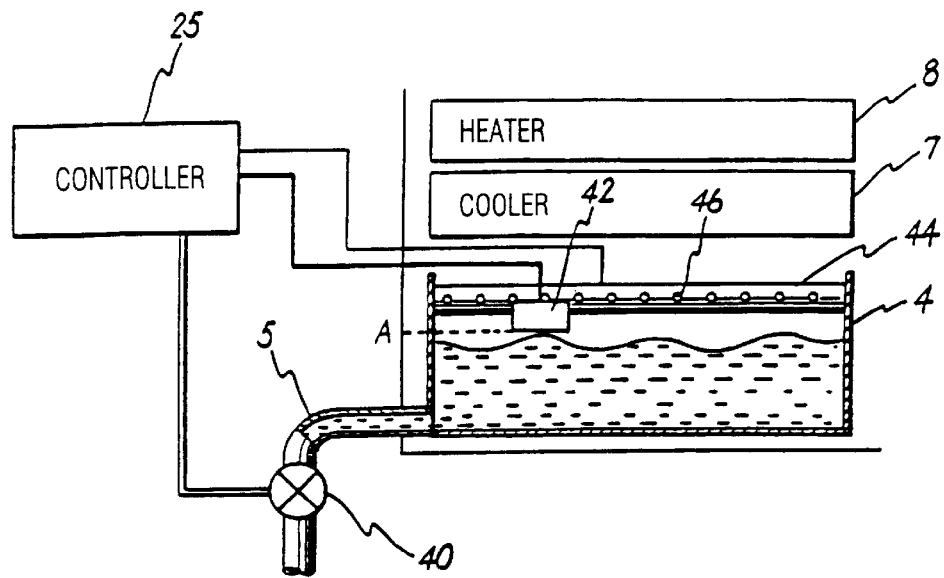
FIG. 9 is a fragmentary view in vertical cross section of the exposure apparatus according to the fifth embodiment, showing the structure near the drain pan.

In the apparatus of this embodiment, a solenoid valve 40 as an opening/closing mechanism is provided at a midway position of the drain pipe 5, as illustrated in FIG. 9. The opening and closing of this solenoid valve 40 are controlled by a controller 25. The reason for the provision of the solenoid valve 40 midway in the drain pipe 5 is as follows:

Normally, superfluous moisture in the atmosphere is condensed into drops of water by the cooler 7 in the air-conditioner 1. The drops are collected in the drain pan 4. The water in the drain pan 4 flows through the drain pipe 5 in a downstream direction. Depending on the environment where the exposure apparatus is installed, little moisture is condensed. If the drain pipe 5 is kept open in this situation, air polluted with impurities such as traces of gases may flow reversely into the drain pan 4 through the drain pipe 5. Thus, the solenoid value 40 is provided in the drain pipe 5, and is normally kept closed. The closure of the drain path in the drain pipe 5 can prevent the polluted air from entering the apparatus.

Assume that the solenoid valve 40 is closed in a normal condition in which superfluous moisture in the atmosphere is condensed into drops of water by the cooler 7 in the air-conditioner 1 as stated above. Over time, the condensate builds up in the drain pan 4. If left as such, the accumulated water overflows the drain pan 4. A prolonged dwell time of the accumulated water in the drain pan 4 would accelerate the concentration of the impurities in the condensate in the drain pan 4. These situations should be avoided. Thus, when more than a certain level of water accumulates in the drain pan 4, it is necessary to open the solenoid valve 40, discharging the collected water to the outside through the drain pipe 5.

Under these circumstances, the apparatus of this embodiment is equipped with a water level sensor 42 at a predetermined latitudinal position inside the drain pan 4. This water level sensor 42 serves as a detector for detecting whether or not the level of water accumulated in the drain pan 4 has reached a certain value. An example of the water level sensor 42 is a semiconductor sensor, such as an ISFET (ion-selective field-effect transistor), which detects the presence or absence of the direct contact of water with the sensor electrode. The output of this water level sensor 42 is monitored by the controller 25. The controller 25 performs control in such a manner as to open the solenoid valve 40 when the water level sensor 42 turns on.

Figure 10:
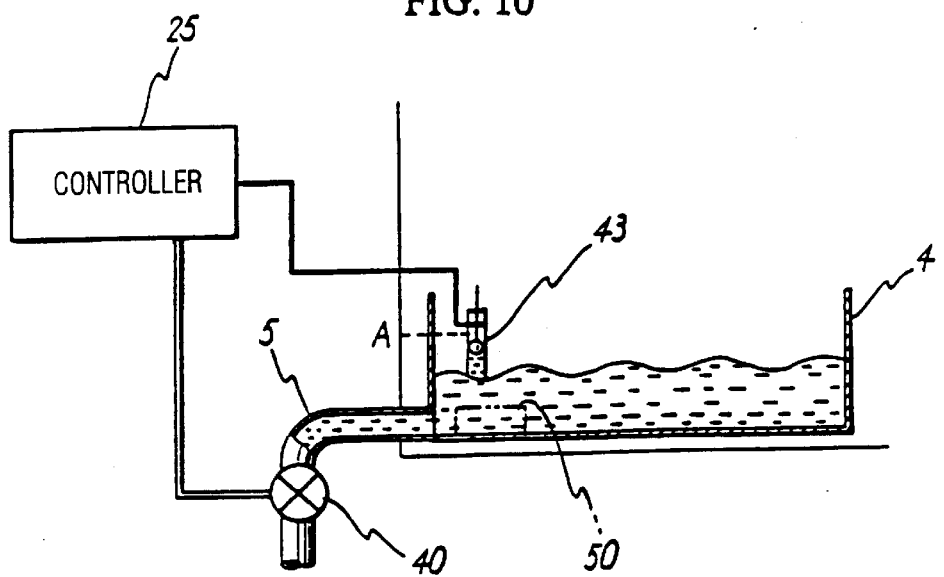
FIG. 10 is a fragmentary view in vertical cross section of the exposure apparatus according to the fifth embodiment using a floating water-level sensor, showing the structure near the drain pan.

Besides the above sensor that detects whether the liquid level of water accumulated in the drain pan 4 has reached a certain value, the water level sensor may be a floating water level sensor 43 as shown in FIG. 10. When this water level sensor 43 is used, it produces an output signal corresponding to the position of the float in the sensor (liquid level). Thus, the controller 25 becomes able to monitor fluctuations in the liquid level over time. This is convenient. In the same sense, the water level sensor may be a noncontact level sensor, such as an ultrasonic level sensor.

Figure 11:
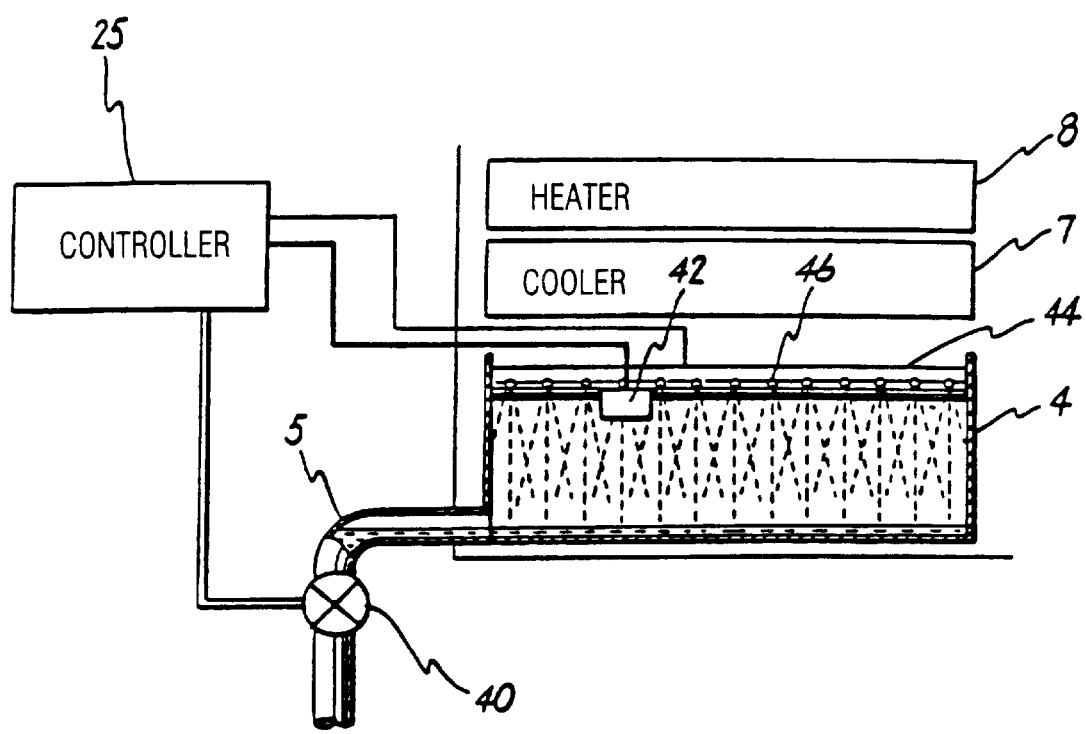
FIG. 11 is a fragmentary view in vertical cross section of the exposure apparatus according to the fifth embodiment, showing the washing of the drain pan by the cleaning device.
Figure 12:
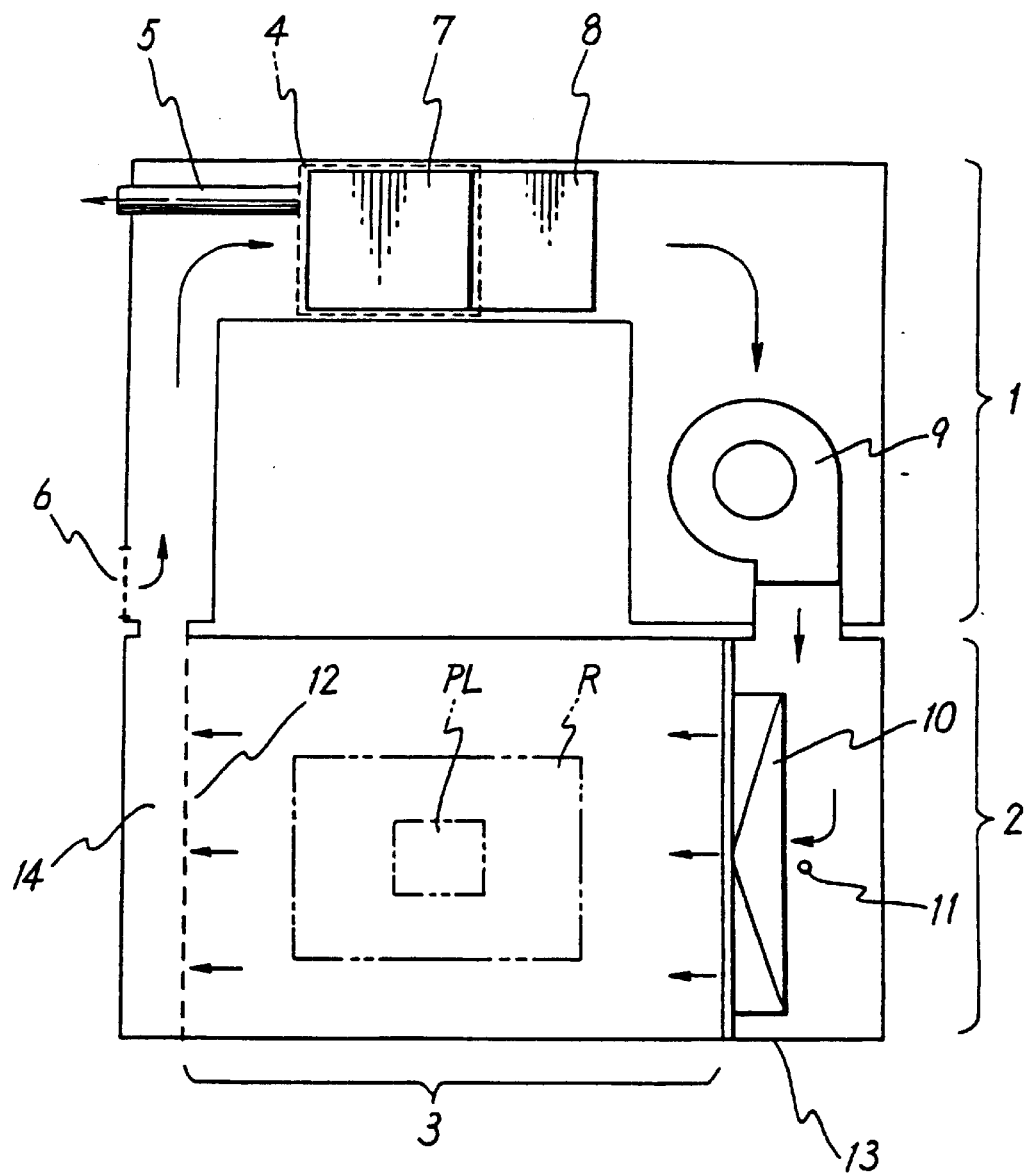
FIG. 12 is a schematic plan view showing the structure of the air-conditioner and the main body of the conventional exposure apparatus.

In the instant embodiment, furthermore, a piping 44 for cleaning is laid horizontally as a liquid supply system at an upper place of the drain pan 4, as shown in FIGS. 9 and 11. This cleaning piping 44 comprises a pipe with wash ports (exhaust nozzles) 46 for cleaning water that are formed at predetermined intervals in the longitudinal direction. Supply and cutoff of water from the water source to the cleaning piping 44 are carried out by a solenoid valve (not shown). This solenoid valve is controlled by the controller 25. As illustrated in FIG. 11, the cleaning piping 44 and the solenoid valve (not shown) constitute a cleaning device which sprays cleaning water (washing water) in a shower over the bottom surface, etc. of the drain pan 4 through the wash ports 46, to clean the inside of the drain pan 4.

Returning to FIG. 1, the interior of the chamber 3 is kept under positive pressure to maintain its cleanliness. consequently, air leaks to the outside from the front surface of the chamber 3, an in-line interface (not shown), etc. To compensate for this leakage, the outside air is taken in through an outside air inlet port (OA port) 6, which is formed in a side wall of the apparatus and communicates with the return duct 14. With the apparatus of this embodiment, in order to prevent the chemically amplified resist from being "T-shaped" and for other purposes, a chemical filter 17 is fitted in the OA port 6. This filter 17 is similar to the chemical filter 16, and can take only clean air into the apparatus by removing chemical substances (impurities) in the air to be taken in through the OA port 6. Since dust from the chemical filter 17 may enter the apparatus, an HEPA filter 19 is disposed inward or downstream of the filter 17. If the pressure loss of the HEPA filter 19 itself is large, fans 18 as shown in FIG. 1 are preferably interposed between the chemical filter 17 and the HEPA filter 19 in order to secure a required supply of air.

The air-conditioning of the exposure apparatus constructed as above is described. The air that has passed through the chamber 13 is returned through the return passage 12 into the return duct 14. The returned air enters the air-conditioner 1 together with the outside air taken in through the OA port 6, the outside air supply port. The mixed air that has entered the air-conditioner 1 is first cooled by the cooler 7. The superfluous moisture carried with the outside air that has been taken in is condensed by radiation fins (not shown). The condensed moisture is removed. Then, the cooled air is heated to a desired temperature by the heater 8. The heated air is supplied by the fan 9 to the main body 2.

The air that has entered the main body 2 is cleaned by the chemical filter 16 and the HEPA filter 10. Only the highly clean air free from fine particles is supplied to the chamber 3.

Similar to the aforementioned earlier technologies, the temperature of the air supplied from the air-conditioner 1 to the main body 2 is adjusted by feedback control exercised by a controller (not shown). In the feedback control, the controller controls the cooler 7 and heater 8 on the basis of output from the temperature sensor 11.

The condensate produced by the radiation fins is collected in the drain pan 4. The level (liquid level) of water accumulated in the drain pan 4 is always monitored by the water level sensor 42 (or 43). The output of this water level sensor 42 (or 43) is monitored by the controller 25. When the liquid level reached a predetermined upper level (concretely, the level at point A in FIGS. 9 and 10), the water level sensor 42 (or 43) detects this fact. Based on the output of the water level sensor 42 (or 43), the controller 25 opens the solenoid valve 40 to render the drain pipe 5 open. As a result, the water accumulated in the drain pan 4 is discharged to the outside of the apparatus through the drain pipe 5.

A predetermined period of time after the opening of the solenoid valve 40, the controller 25 opens the solenoid valve (not shown) constituting the cleaning device, thereby initiating the spraying of cleaning water through the wash ports 46 of the piping 44 for cleaning (see FIG. 11). The spraying of cleaning water need not be continuous, but may be intermediate. The cleaning water is clean water in which impurities, such as ammonia, or microorganisms have been removed, at least, to a ppb level or less.

The above predetermined period of time is the time required for the water in the drain pan 4 to be drained out.

In this case, the start of water spraying is performed, for example, by timer control. Alternatively, when a water level sensor, such as the water level sensor 43 in FIG. 10 is used, the predetermined period of time refers to the time taken for the level detected by the water level sensor 43 to reach a certain value. In other words, the start of water spraying may be controlled by a timer; otherwise, the controller 25 may monitor fluctuations in the output of the water level sensor 43, and shift to a water spraying operation when the change in the output reaches nearly a certain value.

Spraying of clean water (cleaning water) is intended to wash the drain pan 4. The flow rate of water and the duration of water spraying for the purpose of washing can be set at arbitrary values depending on the environment where the apparatus is installed.

During water spraying, the internal wall of the drain pan 4 may be cleaned physically using a scrub means such as a rotary brush (not shown). It is permissible to raise the pressure of cleaning water in the cleaning piping 44, thereby ejecting a jet stream through the wash ports 46. It is also acceptable to combine an ultrasonic wave with cleaning water, thereby increasing the efficiency of washing. A scrub means may be further combined with these means to raise the washing efficiency further.

As the cleaning water, there may be used clean water in which impurities, such as ammonia, or microorganisms have been removed, at least, to a ppb level or less, and which contains a trace amount of a germicidal substance such as hydrogen peroxide. In this case, the multiplication of microorganisms in the drain pan 4 can be inhibited, and the chemical change of nitrogen compounds into ammonia, etc. can be prevented.

The pressure in the air-conditioner 1 is kept negative. The degree of negative pressure is governed by the degree of sealing of the air-conditioner 1 and the main body 2. At a high degree of sealing, water may fail to be completely discharged from the drain pan 4, simply by opening the solenoid valve 40 to open the drain pipe 5. In this view, it is advisable to provide a drain pump 50 (see FIG. 10), such as a water pump mechanism, in the drain pan 4, thereby forcing the water in the drain pan 4 to the outside.

In either case, the solenoid valve 40 continues to be opened until the amount of water in the drain pan 4 decreases to less than a predetermined lower-level amount after stoppage of water spraying. The predetermined lower-level amount may be a value representing the liquid level corresponding to the lower limit that can be measured by the water level sensor 43 of FIG. 10, if it is used. This is because some water may remain undischarged owing to the negative pressure inside the air-conditioner 1. In this case, the water in the drain pan 4 may be forced out by the water pump mechanism 50 after stopping water spraying.

After the drain pan 4 is washed and the water inside is discharged, the controller 25 closes the solenoid valve 40.

The amount of water (water level) in the drain pan 4 that determines the timing of opening the solenoid valve 40 needs to be set separately depending on the environment where the exposure apparatus is installed. This is because the impurities in the atmosphere in the exposure apparatus dissolve and become concentrated in the water in the drain pan 4. Concretely, the rate of accumulation of water in the drain pan 4 differs according to the environment of installation of the exposure apparatus. If the amount of water (water level), the basis for discharge, is fixed, the dwell time of water in the drain pan 4 will differ. In a low humidity environment of installation, the dwell time will be prolonged to accelerate the concentration of the impurities. Hence, it is desired to determine the amount of water with which to start drainage from the drain pan 4, so that the dwell time of water in the drain pan 4 will become constant. That is, in the case of FIG. 9, the position of mounting (height) of the water level sensor 42 is determined by the environment of installation of the exposure apparatus. In the case of FIG. 10, the position of point A is determined by the environment of installation of the exposure apparatus.

In such an extremely low humidity environment of installation that no water is condensed in the cooler 7, the solenoid valve 40 may always be closed.

The foregoing methods can prevent not only the entry of pollutants from the outside of the apparatus, but also the concentration of impurities in the drain pan 4. They can also prevent the secondary pollution that the concentrated impurities are released again.

In the above-described constitution, the solenoid valve may be replaced by an ordinary manual valve. In this case, the operator opens or closes the valve, and begins an operation for spraying cleaning water. Thus, the task of the controller 25 is merely to display the amount of water in the drain pan 4 and a message to the operator about instruction on work; or to display only the amount of water. The frequency of washing may also be set arbitrarily.

If there are a plurality of air-conditioning systems, and the drain piping is divided into a plurality of pipings, then there is need to dispose the solenoid valve in each piping.

According to the exposure apparatus of the instant embodiment, as described above, the solenoid valve 40 provided in the drain pipe 5 is normally closed. This inhibits the entry into the apparatus of pollutant-containing outside air from downstream of the drain pipe 5. The amount of water in the drain pan 4 is monitored by the water level sensor 42 (or 43), and[ ]the solenoid valve 40 is opened by the controller 25 with such a timing that the dwell time of water is not prolonged. Each time the solenoid valve 40 is opened, the condensate is discharged, and the drain pan 4 washed. Thus, the concentration and recurrent release of impurities in the environmental atmosphere can be diminished. While the solenoid valve 40 is open, reverse flow of pollutants from downstream can be prevented. Hence, it becomes possible to effectively restrain hazards, such as the formation of a layer making the surface of a chemically amplified resist slightly soluble, and the decrease in illuminance due to a clouded optical material. Furthermore, the above-described mechanisms act to flush out the impurities in the atmosphere in the exposure apparatus. Thus, when a filter for removing chemical substances is fitted in the internal circulation system of an exposure apparatus, its life can be extended.

According to the first, second and fifth embodiments, impurities are removed by means of the water collector and water supplier. According to the third and fourth embodiments, impurities are removed by means of the chemical filters. Otherwise, a water collector, a water supplier and a chemical filter might be used in combination to more effectively prevent impurities from entering the apparatus from outside.

The present invention has been described in detail by showing the embodiments, to which it is not limited. The invention includes modifications and improvements obvious to those skilled in the art, within the scope of the appended claims. According to each of the embodiments, pure water is supplied to the drain pan. Otherwise, a liquid composed of ingredients which mix with water and are not impurities against the manufacture of semiconductors might be used. The waterproof chemical filters may be made of various materials in accordance with the environment where the exposure apparatus is used and the type of the photo resist used with the apparatus (in accordance with the impurities to be removed).

The exposure body of the exposure apparatus can be applied to, not only projection exposure apparatus called a stepper, but also scanning exposure apparatus of the batch scanning type, step-and-scan type, etc. for making liquid crystal substrates, aligner type exposure apparatus, mirror projection exposure apparatus, and any other exposure apparatus.

In the foregoing first to fifth embodiments, an excimer laser was used as the source of exposure light, and a chemically amplified resist for excimer light was used as a photosensitive material adapted to this use. However, the scope of application of the present invention is in no way restricted thereto. Imagine, for example, an exposure apparatus using a mercury lamp or the like as an exposure light source, e.g., a projection exposure apparatus, such as a stepper, using i-rays as exposure light. In this type of exposure apparatus, modified illumination may be performed in exposing a contact hole. That is, the aperture stop of an illumination system is not an ordinary circular diaphragm, but an aperture stop with a much smaller aperture (so-called small a diaphragm). At this time, the sensitivity of the resist should be increased to compensate for the insufficient quantity of light. For this purpose, a chemically amplified resist may be coated onto a substrate. As noted above, the present invention is effective in any cases in which a chemically amplified resist needs to be used depending on the light source, lighting conditions, etc.

As stated above, the water collector and the water supply system for supplying water to the collector can prevent impurities from indirectly entering the exposure apparatus from outside, and the impurities in the collector from being concentrated. In addition, the chemical filters remove impurities in the condensed moisture, and adsorb gaseous impurities which have entered through the drainage channel from outside, so that the gaseous impurities are prevented from entering the exposure body. This effectively prevents impurities from accumulating at the inlet of the drainage channel. It is therefore possible to keep the chemical atmosphere in the apparatus clean, and effectively restrain the occurrence of evils such as the occurrence of a layer which makes the surface of a chemically amplified resist slightly soluble and a decrease in illuminance due to a blur in an optical material.

What is claimed is:

1. A method for controlling an atmosphere in a chamber accommodating an exposure unit which transfers an image of a mask pattern onto a photosensitive substrate, the method comprising:

adjusting the atmosphere in the chamber to a predetermined condition by using an air-conditioner;

draining a product produced in the air-conditioner via a drain path to outside of the chamber when the atmosphere in the chamber is adjusted to the predetermined condition; and preventing a pollutant from entering the chamber from the outside of the chamber via the drain path by using a mechanism provided in the drain path.

2. The method according to claim 1, wherein the mechanism includes a trapping system and a liquid supplying system, and the method further comprises:

trapping temporarily the product with the trapping system before draining the product; and preventing the pollutant from entering the chamber by supplying clean liquid continuously or intermittently to the trapping system with the liquid supplying system.

3. The method according to claim 2 wherein the trapping system is a U-tube which is provided on the drain path.

4. The method according to claim 3 wherein the U-tube always holds an amount of the liquid containing the product, which is based on a pressure difference between an outside of the chamber and an inside of the chamber.

5. The method according to claim 2, further comprising:

detecting an amount of the liquid containing the product in the trapping system; and supplying the clean liquid to the trapping system on the basis of a result of the detection so that a substantially constant amount of the liquid stays in the trapping system.

6. The method according to claim 2, wherein the trapping system is a drain Pan.

7. The method according to claim 2, wherein the clean liquid is water substantially free from chemical impurities or microorganisms.

8. The method according to claim 1, wherein the pollutant is prevented from entering the chamber by a filter provided in the drain path and which removes the pollutant in the product.

9. The method according to claim 8, wherein the filter is a waterproof chemical filter, which adsorbs the pollutant entering from an outside of the chamber.

10. The method according to claim 9, further comprising:

detecting a concentration of the pollutant adsorbed on the waterproof chemical filter.

11. The method according to claim 10, wherein the waterproof chemical filter has an ion exchange resin.

12. The method according to claim 1, wherein the exposure unit is a batch exposure type projection exposure apparatus or a scanning projection exposure apparatus.

13. The method according to claim 1, wherein the mechanism includes an opening/closing valve provided in the drain path, and the method further comprises:

controlling the opening/closing valve in order to prevent the pollutant from entering the chamber.

14. The method according to claim 13, wherein the mechanism further includes a trapping system, and the method further comprises:

trapping temporarily the product by the trapping system before draining the product via the drain path;

detecting an amount of a liquid containing the product in the trapping system; and controlling the opening/closing valve on the basis of a result of the detection.

15. The method according to claim 14, further comprising:

opening the opening/closing valve when a predetermined upper-limit amount of the liquid is trapped in the trapping system; and closing the opening/closing valve when the liquid in the trapping system has been drained to less than a predetermined amount.

16. The method according to claim 14, further comprising forcibly draining the liquid in the trapping system by a drain pump.

17. The method according to claim 16, further comprising:

supplying clean liquid continuously or intermittently to the trapping system.

18. The method according to claim 17, wherein the clean liquid is water containing a trace amount of a germicidal ingredient and substantially free from chemical impurities and microorganisms.

19. The method according to claim 1, wherein the pollutant is contained in air incoming from an outside of the chamber.

* * * * *